United States Patent [19]
Cheng

[11] Patent Number: 5,670,888
[45] Date of Patent: Sep. 23, 1997

[54] METHOD FOR TRANSPORTING AND TESTING WAFERS

[76] Inventor: David Cheng, 711 Hibernia Ct., Sunnyvale, Calif. 94087

[21] Appl. No.: 484,792

[22] Filed: Jun. 7, 1995

Related U.S. Application Data

[62] Division of Ser. No. 981,801, Nov. 25, 1992, Pat. No. 5,479,108.

[51] Int. Cl.⁶ .................................................. G01R 31/02
[52] U.S. Cl. ........................................ 324/754; 324/758
[58] Field of Search ................................. 324/754, 758

[56] References Cited

U.S. PATENT DOCUMENTS

| | | | |
|---|---|---|---|
| 4,204,155 | 5/1980 | Terry | 324/158 F |
| 4,665,360 | 5/1987 | Phillips | 324/754 |
| 4,749,943 | 6/1988 | Black | 324/754 |
| 4,755,746 | 7/1988 | Mallory et al. | 324/158 F |
| 4,755,747 | 7/1988 | Sato | 324/158 F |
| 4,775,281 | 10/1988 | Pretakis | 414/416 |
| 4,786,867 | 11/1988 | Yamatsu | 324/758 |
| 4,818,169 | 4/1989 | Schram et al. | 414/331 |
| 4,907,931 | 3/1990 | Mallory et al. | 414/225 |
| 4,929,893 | 5/1990 | Sato et al. | 324/158 F |
| 5,166,603 | 11/1992 | Hoshi | 324/758 |
| 5,186,238 | 2/1993 | del Puerto et al. | 16/80.4 |
| 5,220,279 | 6/1993 | Nagasawa | 324/754 |

*Primary Examiner*—Kenneth A. Wieder
*Assistant Examiner*—Russell M. Kobert
*Attorney, Agent, or Firm*—Hickman Beyer & Weaver

[57] ABSTRACT

A method and apparatus for handling wafers. A wafer pick moves along a horizontal x-axis to unload a wafer from a cassette and position the wafer over a chuck. The chuck moves upwardly along a z-axis perpendicular to the surface of the wafer and lifts the wafer off the pick. The pick retracts through a slot in the chuck and a test probe moves along the x-axis to position itself over the wafer and chuck with reference to a calculated wafer center. The chuck then moves upwardly to engage the surface of the wafer with the probe. Wafer characteristics are tested at several test points located on a circle on the surface of the wafer by repeatedly lowering the chuck, rotating the chuck by a small amount, and raising the chuck to engage the wafer with the probe. The probe is then positioned to test another circle of points.

24 Claims, 7 Drawing Sheets

METHOD FOR TRANSPORTING AND TESTING WAFERS

This is a divisional of application Ser. No. 07/981,801, filed on Nov. 25, 1992, now U.S. Pat. No. 5,479,108.

BACKGROUND OF THE INVENTION

1. Field of the Invention

This invention relates to the handling of wafers, and more particularly to the handling of wafers in a wafer testing apparatus.

2. Background of the Related Art

The manufacture of integrated circuits (I.C.'s) begins with blank, unpatterned semiconductor wafers. These wafers undergo a number of sometimes critical process steps before being formed into the final I.C. form. A substandard wafer can affect the number of usable I.C.'s on a wafer (yield). It is therefore desirable to have a machine for testing wafers to ensure the wafers meet a customer's standards to maximize wafer yield.

The testing of wafers is often accomplished by an automated process, in which robots continuously handle and test the wafers. Robot testing and handling tends to be more efficient than manual testing and handling of wafers, since robots can be much faster and more precise than human operators. Also, robots tend to be less contaminating than humans when handling wafers.

Typical robot wafer handling systems move a wafer into testing position and move a probe assembly to engage the wafer surface and take measurements. Some robot systems also have the ability to remove a wafer from a wafer cassette, set it down on a testing surface, and place the wafer back into the wafer cassette after testing in a process known as cassette-to-cassette handling.

Prior art wafer handling systems vary in structure and method of handling wafers. In U.S. Pat. No. 4,204,155, M. Terry describes an automatic four-point probe mechanism that repeatedly lowers a four-point resistivity head onto a semiconductor wafer. In U.S. Pat. No. 4,755,746, Mallory et al. describes an automatic system for resistivity testing of semiconductor wafers, and includes a handling system whereby a wafer on a rotatable platform is lowered to a testing area. A probe assembly moves into place over the wafer and lowers so that the probe contacts the wafer to perform tests. In U.S. Pat. No. 4,907,931, Mallory et al. describes a semiconductor wafer handling apparatus which automatically moves wafers between wafer cassettes and a wafer test system. A shuttle arm is aligned with a wafer in a cassette and a spatula extends to remove the wafer from the cassette. The shuttle arm then rotates and moves the wafer to a testing area, where the arm lowers and retracts, leaving the wafer to be tested. The wafer is removed and placed into the cassette by the reverse operation.

While the prior art wafer handling and test systems have been successful in handling and testing wafers, they tend to exhibit some undesirable characteristics. For example, the prior art moves both the test probe and the wafer in the direction perpendicular to the wafer surface, where the test probe is moved to engage the probe with the surface of the wafer, and the wafer is moved to facilitate its loading and unloading. This duplication of movement increases costs of the wafer handling equipment due to the extra motors and controls that are required.

A further problem with the prior art wafer handling system is the complexity of the handling apparatus. The wafer-handling shuttle arm in the prior art requires several motors and must move along several axes to position a wafer correctly on a test area. Complex robots are expensive and require a great deal of maintenance to keep them operating correctly. Such costs and maintenance are undesirable in production environments.

What is needed is an apparatus and method that will handle and test a wafer efficiently and economically. Wafers would therefore be tested faster and with less production and maintenance costs, thereby increasing the amount of manufactured products and revenue.

SUMMARY OF INVENTION

The present invention addresses the problems in the prior art by providing a method and apparatus for handling wafers by moving the wafers and probe assembly along a horizontal axis and moving a chuck in the direction perpendicular to the surface of the wafer to engage the probe assembly. Only five axes of movement are required for complete cassette-to-cassette testing in the present invention, as opposed to six or more axes of movement required in the prior art.

The apparatus comprises a wafer pick operative to pick up a wafer and transport the wafer to a test area. The pick moves in a horizontal plane and stops when the wafer is positioned over a rotatable chuck. The chuck moves upward to engage the wafer and the pick retracts from the chuck, leaving the wafer behind. A probe assembly then moves in the same plane as the pick to position itself over the wafer. The chuck then moves upwardly so that the surface of the wafer engages the probe assembly for testing purposes.

The probe assembly preferably tests the wafer at several locations on the surface of the wafer. Preferably, the center of the wafer and the wafer flat are found to provide a reference for the test point locations. Once the measurements on one location on the wafer surface are completed, the chuck preferably moves downward and rotates. The chuck then moves upwardly to engage the probe with the wafer surface at a new location and measurements are made. Once all the points in a circular path on the wafer surface are tested, the probe assembly indexes horizontally and another circular path on the wafer surface is tested. Substantially all of the wafer surface can be tested in this manner.

The apparatus includes a wafer cassette assembly that moves the cassette upwardly and downwardly so that the pick has access to all the wafers in the cassette. The pick can remove each wafer held in the cassette, carry each wafer to the chuck to be tested, and load each wafer back into the cassette.

The present invention has the advantage of moving only the chuck upwardly and downwardly, thereby reducing the number of motions required for the testing apparatus and saving cost and maintenance.

The present invention also has the advantage of moving the pick and the probe in the same horizontal plane along the same axis, thereby reducing the complexity of the apparatus and saving production and maintenance costs.

These and other advantages of the present invention will become apparent to those skilled in the art after reading the following descriptions and studying the various figures of the drawings.

DETAILED DESCRIPTION OF THE PREFERRED EMBODIMENTS

Figure 1:
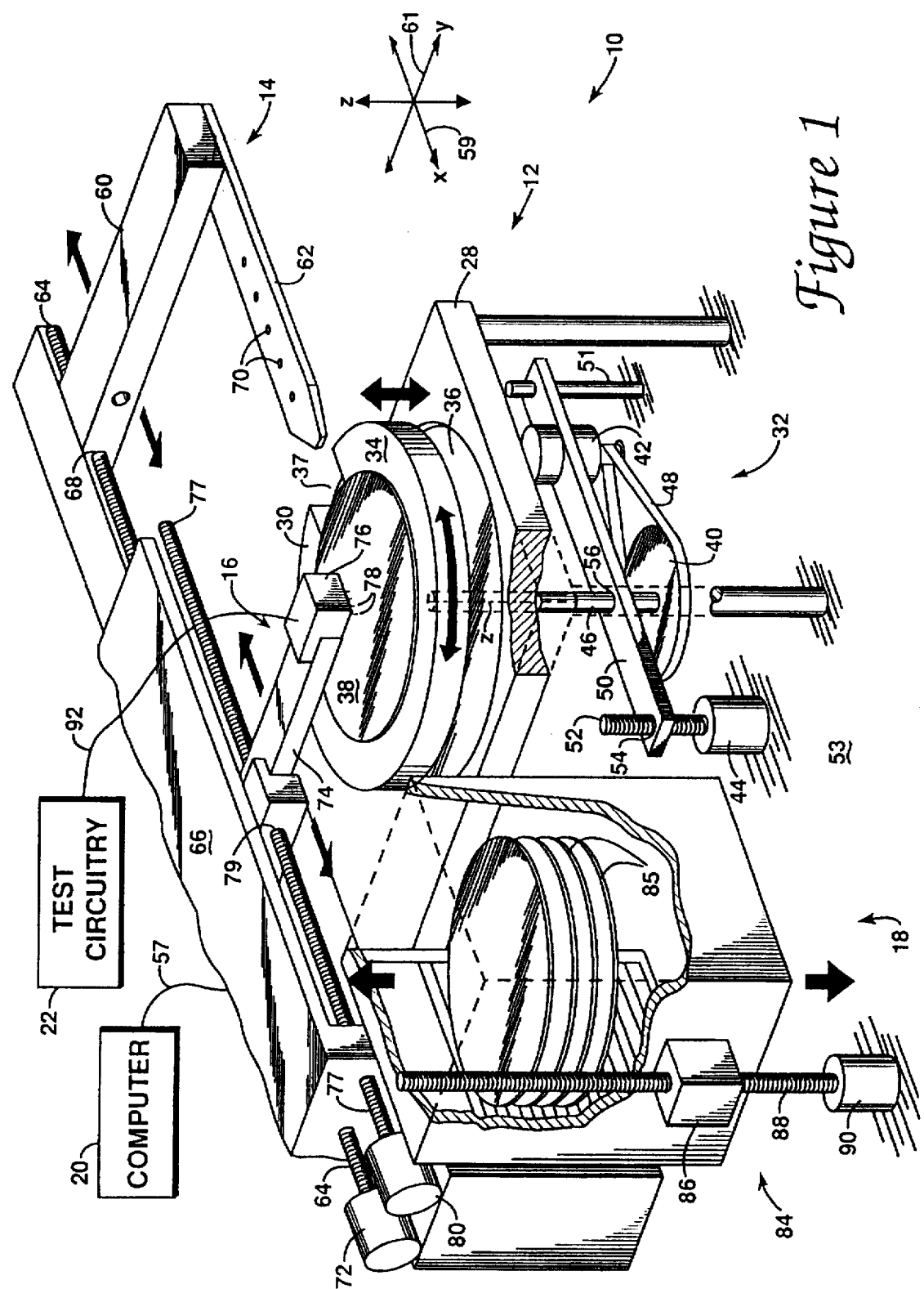
FIG. 1 is a perspective view of a wafer handling apparatus of the present invention.

In FIG. 1, a wafer handling apparatus 10 comprises a chuck assembly 12, a wafer pick 14, a probe assembly 16, a wafer cassette assembly 18, a computer 20, and test circuitry 22.

Chuck assembly 12 comprises a base platform 28, a testing chuck 30, and a drive assembly 32. Base platform 28 is preferably a table structure that supports testing chuck 30 and allows drive mechanism 32 to be located underneath the testing chuck. Testing chuck 30 is preferably a disc-shaped chuck that rotates around a central z-axis. Testing chuck 30 is also operative to move upwardly or downwardly along the z-axis perpendicular to the surface 34 of the testing chuck (the z-axis). In its fully lowered position, the testing chuck 30 rests in a circular groove 36 of base platform 28. A wafer 38 rests on the surface 34 of testing chuck 30 and can engage probe assembly 16 when testing chuck 30 is raised adequately and probe assembly 16 is positioned over the testing chuck 30.

Testing chuck 30 includes a slot 37 extending radially from the center of testing chuck 30 to an edge of the chuck. The slot is about one-fourth an inch deep and 1¼ inches wide. Testing chuck 30 also includes concentric vacuum grooves (not shown) which are operative to hold wafer 38 to the surface of the testing chuck when coupled to a vacuum pump. Such vacuum chucks are well-known in the art.

Drive assembly 32 is operative to rotate testing chuck 30 and to move testing chuck 30 up and down the z-axis. The drive assembly comprises a pulley 40, a first motor 42, and a second motor 44. Pulley 40 is connected to testing chuck 30 by a shaft 46 that extends through the base platform 28 through suitable bearings (not shown). Pulley 40 is connected to motor 42 by a drive belt 48. Motor 42 rotates pulley 40 and thereby rotates shaft 46 and testing chuck 30. Motor 42 is connected to a support 50 of motor 44. One end of support 50 is provided with a threaded nut 54 which engages a lead screw 52 coupled to a shaft of motor 44. Threaded nut 54 can be an anti-backlash nut or a ball screw nut. The support 50 is connected to the main shaft 46 by bearing 56. The far end of support 50 is secured to the motor 42 by a secure connection, such as a welding connection, and to guide shaft 51. The motor 44 is positioned on a fixed surface 53 that supports base platform 28. When the shaft of motor 44 rotates, the support 50 moves along the z-axis and carries the shaft 46, pulley 40, motor 42, and testing chuck 30 along the z-axis. The bearing 56 of support 50 allows the shaft 46 to rotate freely while still being securely held by the support 50.

Motors 42 and 44 are preferably stepper motors controlled by computer 20 through main bus 57. The computer can rotate the stepper motors in either direction with precise steps, allowing the testing chuck to rotate and move in the z-axis in small, precisely-defined increments.

Alternatively, the testing chuck 30 can be moved parallel to the x-axis 59 in addition to being rotated. This movement can be implemented by positioning parallel tracks on the sides of the base platform 28 and moving the chuck assembly 12 along the tracks using wheels or gears. The movement can be driven by a stepper motor similar to motors 42 and 44. In such an embodiment, the wafer 38 can be completely tested using a stationary probe assembly 16 and moving only the testing chuck 30.

Wafer pick 14 includes a pick shuttle 60 and a wand 62. Pick shuttle 60 is coupled to a lead screw 64 supported by a base support 66. The central axis of lead screw 64 is positioned horizontally parallel to x-axis 59. In the preferred embodiment, the pick shuttle 60 includes a threaded nut 68 that engages lead screw 64. The screw 64 helps hold the wafer pick 14 and is also operative to move the wafer pick in a direction parallel to the x-axis 59.

The other end of pick shuttle 60 is connected to wand 62. Wand 62 extends towards the wafer cassette assembly 18 (detailed below) about six inches and is parallel to x-axis 59. Wand 62 is aligned with slot 37 in testing chuck 30 so that wand 62 can fit within slot 37. Wand 62 includes apertures 70 that are coupled to a vacuum pump to securely hold a wafer or similar workpiece to the wand by atmospheric pressure. Vacuum wands are well-known to those skilled in the art.

Motor 72 is coupled to lead screw 64 and is operative to rotate the lead screw 64. When lead screw 64 is rotated, wafer pick 14 moves along the x-axis along the length of the shaft. Motor 72 is preferably a stepper motor and is precisely controlled by computer 20 to position wafer pick 14.

Other mechanisms can be used to move the wafer pick parallel to the x-axis. For example, the pick shuttle 60 can be driven along a rod by motor gears. Or, the shuttle can be driven by a hydraulic or pulley system. Any mechanism that provides precise movement and control will function for pick shuttle movement.

Probe assembly 16 comprises probe arm 74 and test head 76. On one end, probe arm 74 is preferably connected to a lead screw 77 supported by base support 66. Probe arm 74 includes a threaded nut 79 that engages screw 77, permitting probe arm 74 movement parallel to the x-axis along the length of the screw 77.

On its other end, probe arm 74 is connected to test head 76. The test head includes probes 78 which are designed to take test measurements on the wafer surface. In the preferred embodiment, the test head includes a four-point probe apparatus that includes four metal, spring-loaded probes that engage the surface of a wafer. A current is usually induced in the outer probes of the four probes, and a voltage is measured across the inner probes. Such a probe is designed to measure wafer resistivity and film thickness. Four-point probe apparatus are well known in the art.

Probe arm 74 is operative to position the test head 76 over variable locations on the wafer 38. The probe arm 74 moves parallel to the x-axis along lead screw 77 by the use of motor 80. Motor 80 rotates lead screw 77, which moves probe arm 74 along the lead screw 77. Motor 80 is preferably a stepper motor controlled by computer 20.

In other embodiments, different mechanisms can be used to move the probe assembly along the x-axis. These mechanisms include similar mechanisms as those discussed above for the pick shuttle 60.

In still other embodiments, the probe arm can be set up to move in both the x-axis and y-axis directions. In such an embodiment, lead screw 77 is able to move in the y-axis direction by the use of tracks or guides positioned on both sides of the shaft 76. The probe arm moves in the x-direction along the shaft, and moves in the y-direction as the shaft moves along the y-axis. In such an embodiment, the rotation of testing chuck 30 is not required to test the entire surface of the wafer and may be eliminated (see FIG. 5).

Wafer cassette assembly 18 includes a cassette 82 and a drive assembly 84. Cassette 82 is preferably an industry standard tray designed to hold a number of wafers 85. The cassette 82 is positioned on one side of the chuck assembly 12 with its opening facing the testing chuck 30 and the wand 62. The bottom wafer 85 in the cassette 82 is positioned at a height slightly above the height of wand 62 of wafer pick 14 so that the wand can move beneath the bottom wafer. Once the wand is beneath the wafer, the cassette 82 is lowered so that the wafer is situated on the wand 62. The pick 14 is then moved back towards the chuck 30.

Drive assembly 84 includes a brace 86, a lead screw 88, and a motor 90. The brace 86 is attached to the back of cassette 82. The brace can also include a platform which supports the cassette 82. Brace 86 includes a threaded nut 92 engaged with lead screw 88. Screw 88 is rotated by motor 90. Motor 90 is positioned on a stable surface 53 below the cassette 82. As screw 88 rotates, brace 86 moves upwardly and downwardly parallel to the z-axis along part of the length of the shaft, and carries cassette 82. Motor 90 is preferably a stepper motor and is computer-controlled. Cassette 82 can be positioned to align a particular wafer in the cassette 82 with the wand 62 of wafer pick 14. When a wafer is tested and replaced in the cassette, the cassette is moved to align the next wafer to be tested with the wand 62. In this way, all the wafers in the cassette 82 can be tested.

Cassette 82 can be removed from brace 86 when all the wafers in the cassette have been tested. A similar cassette can then be connected to the brace 86 to allow new wafers to be tested. Alternately, the same cassette can be removed from brace 86, unloaded and loaded with new wafers, and reconnected to brace 86.

Computer 20 preferably comprises a microprocessor-controlled digital computation apparatus that is coupled to the wafer handling apparatus by a bus 57. The computer 20 can control the stepper motors 42, 44, 72, 80 and 90 of the apparatus to accomplish the wafer handling and testing process.

Test circuitry 22 comprises circuitry operative to control the test head 76 of the probe assembly 16. Test circuitry 22 is coupled to the test head 76 by a bus 92.

Figure 2A:
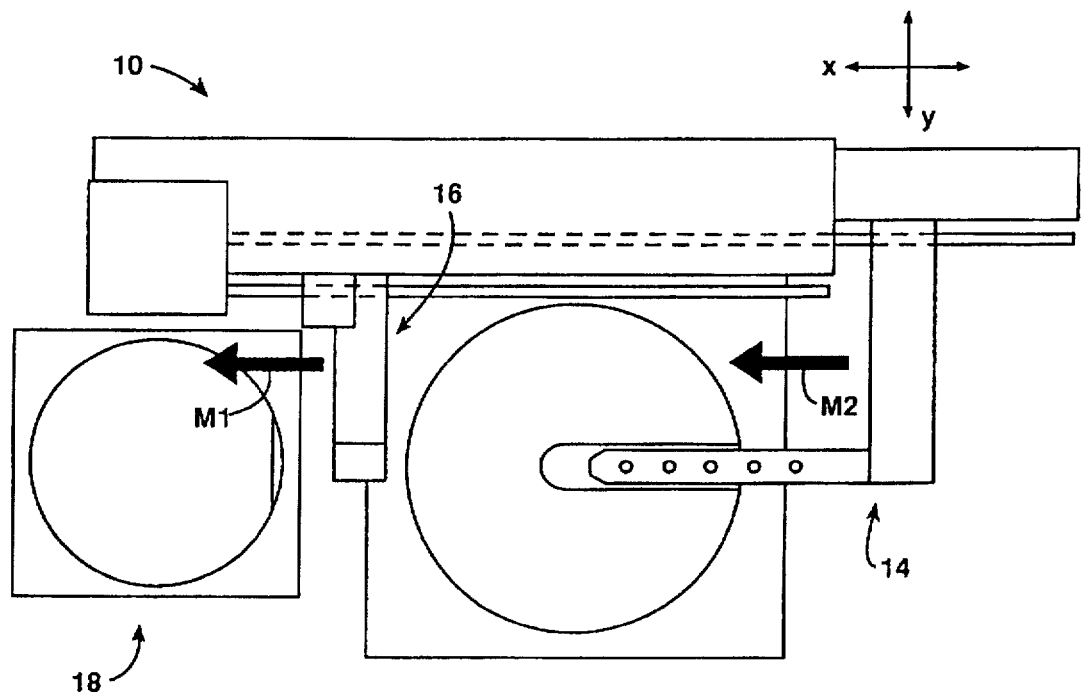
FIGS. 2a–2d are four sequential top plan views of the wafer handling apparatus.

FIGS. 2a–2d illustrate several top plan views of the apparatus 10. FIG. 2a shows an initial state of the wafer handling apparatus 10 where the probe assembly 16 and wafer pick 14 are at a starting position. The process is initiated when the probe assembly 16 and the wafer pick 14 are both moved towards the wafer cassette assembly 18 as indicated by the arrows M1 and M2, respectively.

Figure 2B:
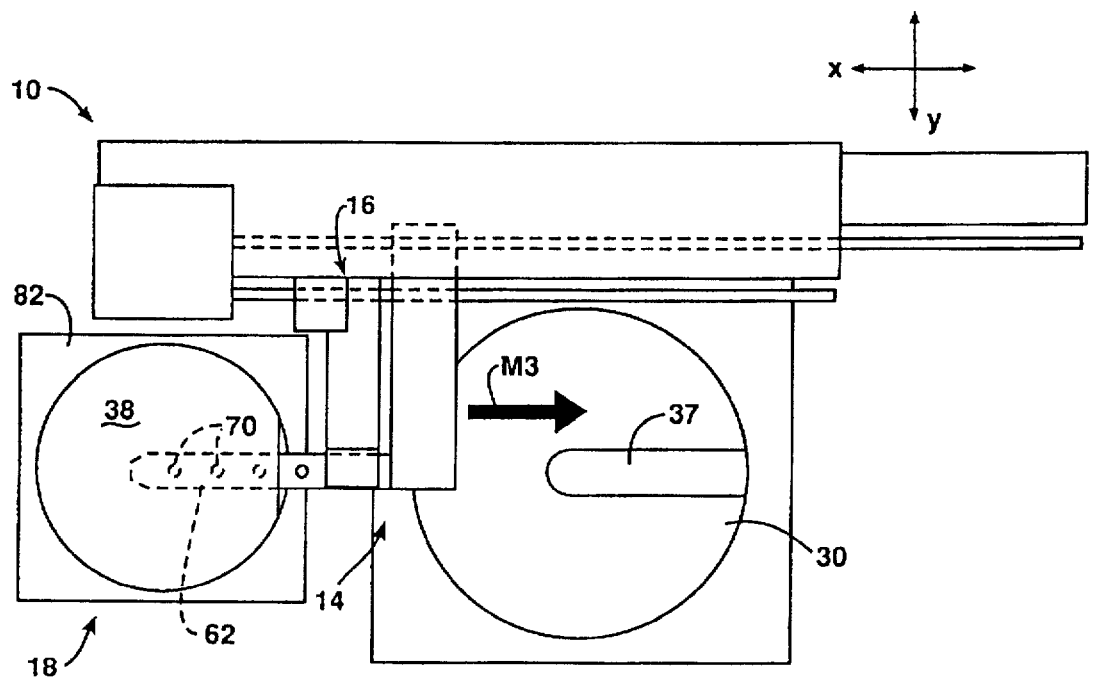

FIG. 2b shows the wafer loading position of the probe assembly 16 and wafer pick 14. Probe assembly 16 is positioned close to cassette assembly 18 so that wand 62 of wafer pick 14 can extend into the cassette assembly. The wand 62 is positioned beneath wafer 38 in cassette 82, and the vacuum pump coupled to the wand 62 is activated, securing wafer 38 to the wand 62. The cassette assembly 18 may be slightly lowered. The wafer pick 14 then is moved back towards the testing chuck 30 as indicated by arrow M3.

Figure 2C:
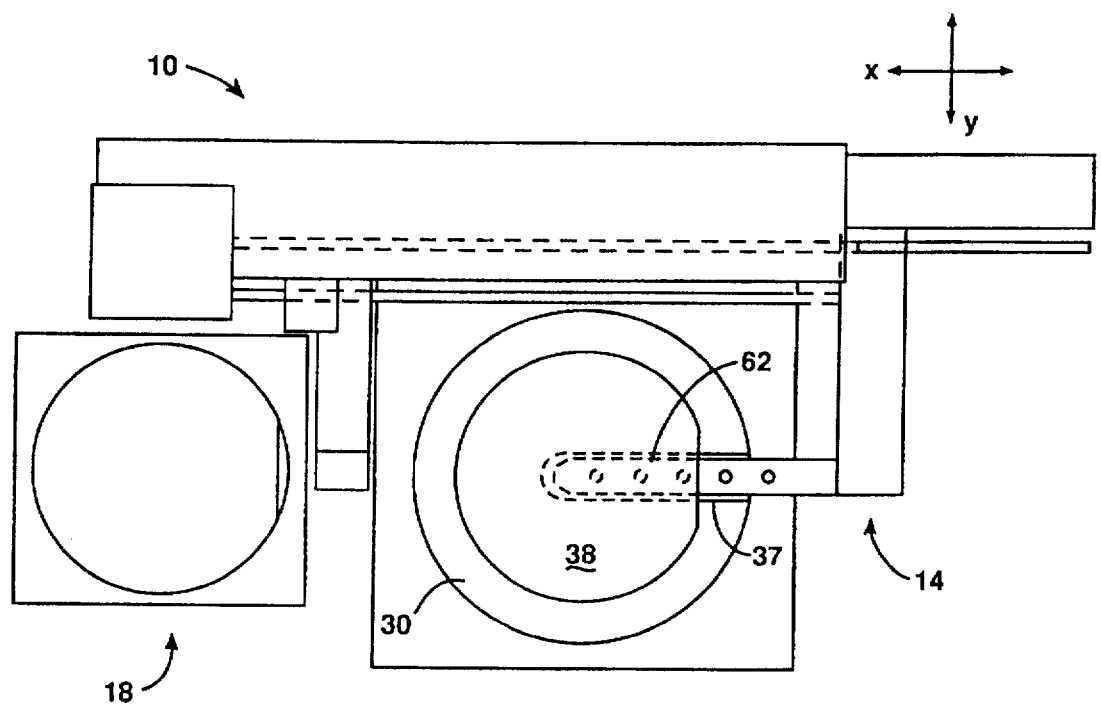

FIG. 2c illustrates the placement of the wafer 38 on the testing chuck 30. Wafer pick 14 is positioned so that the wafer 38 is centered over the testing chuck 30. Testing chuck 30 is elevated so that the wand 62 fits into slot 37 and the surface of testing chuck 30 engages the bottom surface of the wafer 38, lifting the wafer off of the wand 62. The vacuum pump connected to wand 62 is deactivated, and the vacuum pump connected to chuck 30 is activated.

Figure 2D:
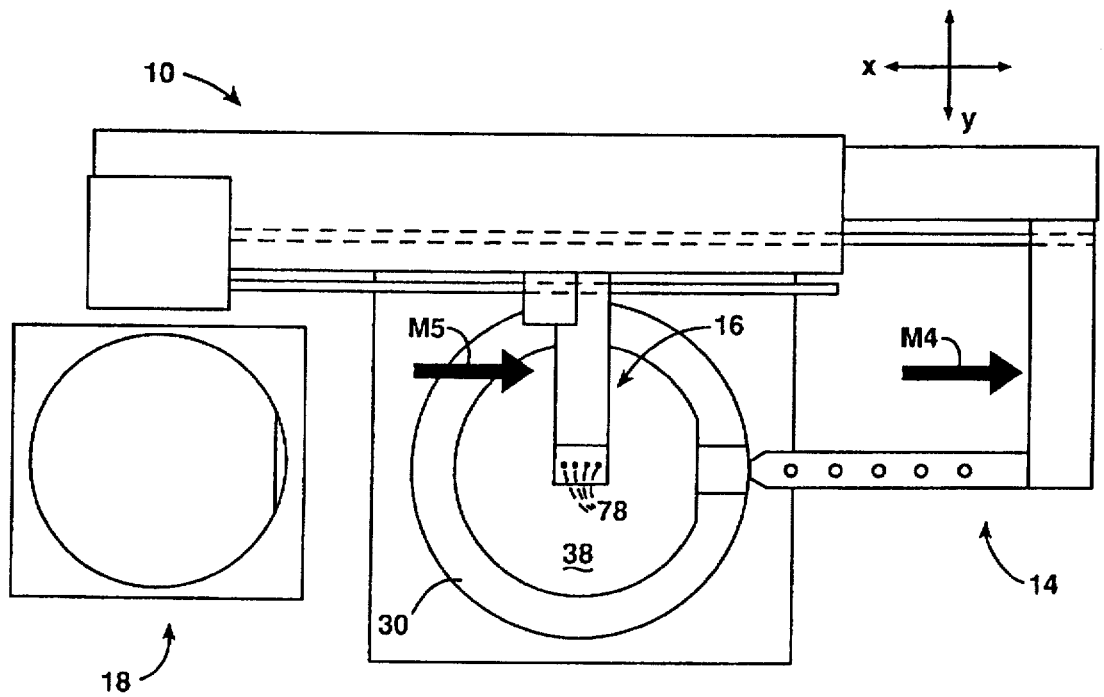

FIG. 2d shows the testing positions of the probe assembly 16 and wafer pick 14. Wafer pick 14 retracts from testing chuck 30 and probe assembly 16 is positioned over the wafer 38 as illustrated by arrows M4 and M5, respectively. Preferably, the center and flat of the wafer are found using a commercially available flat and center finder. Once probe assembly 16 is positioned in the desired testing position, testing chuck 30 elevates a small distance to engage the surface of the wafer 38 with the probes of the test head. The measurements are taken, and the testing chuck moves down to disengage the wafer with the test head. If more test points on the wafer are to be tested, the chuck 30 is rotated and/or the probe assembly 16 is translated and the next test point is tested (see FIG. 5). If the measuring process is over, the wafer pick puts the wafer back into the cassette assembly 18 using the reverse of the procedure described above. The process is repeated for the next wafer positioned above the last wafer tested in the cassette, until all the wafers have been tested.

Figure 3:
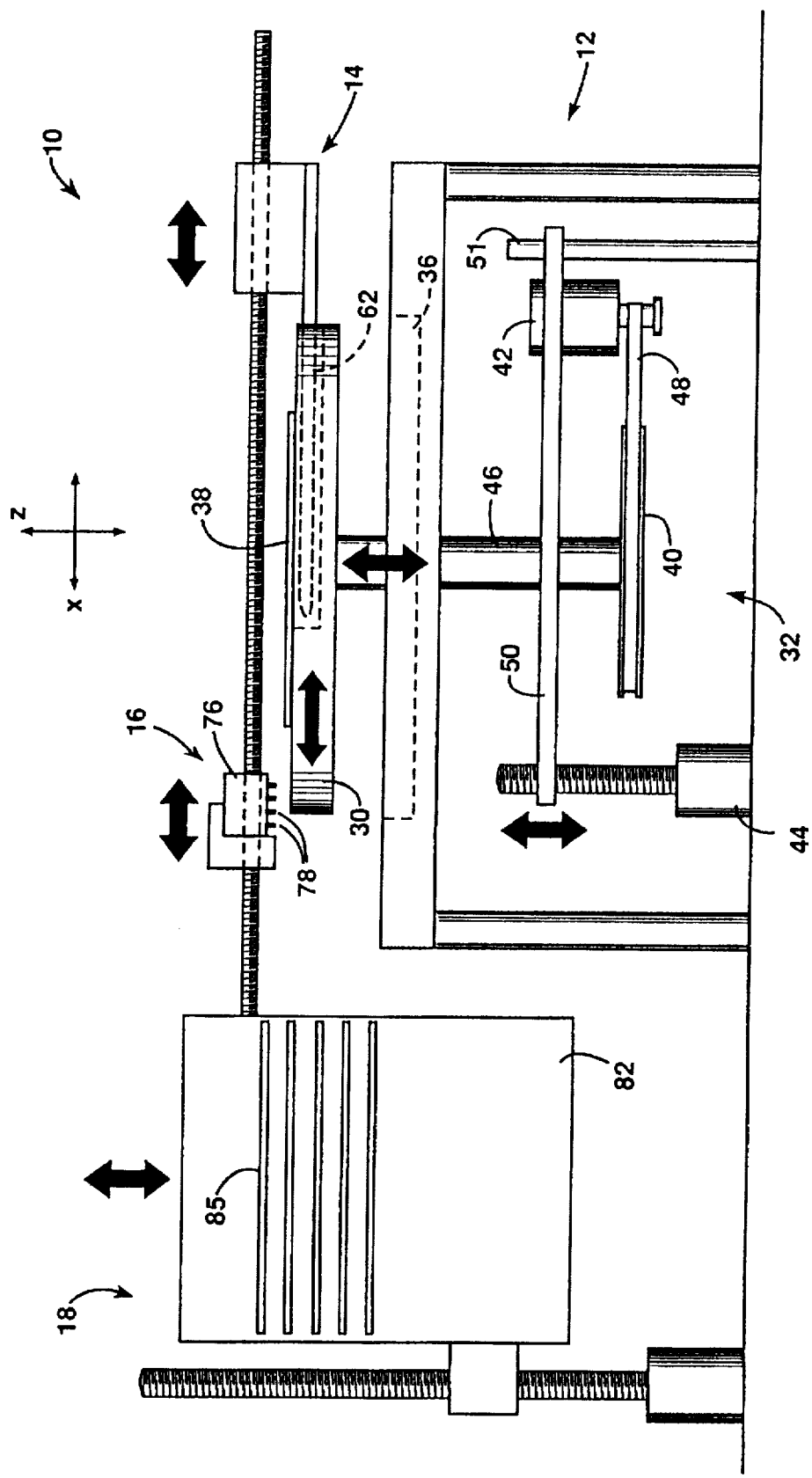
FIG. 3 is a side elevational view of the wafer handling apparatus.

FIG. 3 is a side elevational view of the wafer handling apparatus 10. The various motions of the chuck assembly 12, wafer pick 14, probe assembly 16, and wafer cassette assembly 18 are shown with arrows. The position of the drive assembly 32 relative to the testing chuck 30 is also shown. In the present embodiment, the probe arm and pick shuttle are at the same level on the z-axis and thus cannot move past one another.

The test head 76 of probe assembly 16 is positioned higher than the wand 62 of wafer pick 14. This positioning allows the wafer 38 to be lifted from the wand 62 and still have enough space to engage the test probes 78 of the test head.

A total of five motions are shown in FIG. 3. The probe assembly 16 has movement parallel to the x-axis, the wafer pick 14 has movement parallel to the x-axis, the testing chuck 30 has movement parallel to the z-axis and rotational movement around the z-axis, and the wafer cassette 82 has movement parallel to the z-axis.

Figure 4:
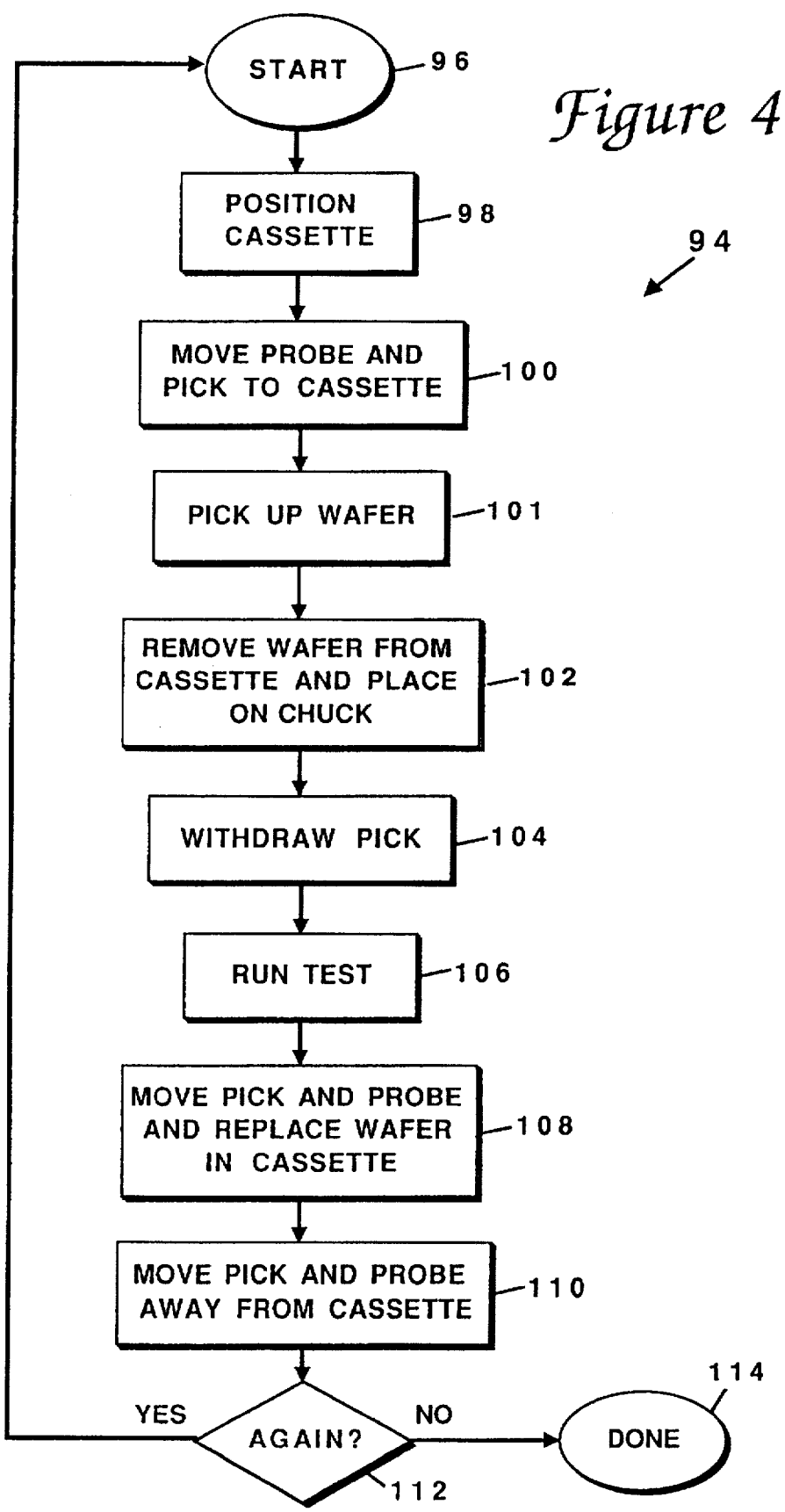
FIG. 4 is a flow diagram of the wafer handling process.

FIG. 4 is a flow diagram 94 of the wafer handling process. The process begins at a step 96 and, in a step 98, the cassette 82 holding wafers 85 is positioned parallel to the z-axis so that a wafer that has not been tested is positioned at about the same level as wand 62 of wafer pick 14. In step 100, probe assembly 16 and wafer pick 14 are moved to the cassette so that the wand 62 is positioned under the wafer to be tested.

In step 101, the wafer 38 is secured to the wand 62 by activating the vacuum pump coupled to apertures 70. The wafer is removed from the cassette in step 102 and the wafer pick 14 is positioned over the testing chuck 30. Testing chuck 30 elevates to lift the wafer off the wand 62 and holds the wafer to the testing chuck using vacuum slots.

In step 104, the wafer pick 14 deactivates the vacuum suction through holes 70 and withdraws in the direction opposite to the wafer cassette 82. In step 106, the wafer 38 is tested. The testing process is described in detail with reference to FIG. 5. Once the testing is complete, the wafer pick 14 and probe assembly 16 are moved in step 108 to replace the tested wafer back into the cassette 82. This is done in the reverse process as described above: the chuck 30 elevates, the wand 62 moves under wafer 38 through slot 37, and the chuck lowers and leaves the wafer on the wand. The probe assembly and wafer pick are then moved to the cassette assembly 18 to replace the wafer back to its slot in the cassette 82.

In step 110, the wafer pick 14 and probe assembly 16 are moved away from the cassette assembly 18 to their resting positions. Next, in step 112, the computer checks if any more wafers in the cassette need to be tested. This can be checked in a variety of ways. The operator can input to the computer the number of wafers in the cassette before the testing process begins. The computer stores the number in a variable and decrements the number every time a wafer is completely tested. When the number reaches zero, there are no more wafers in the cassette to be tested.

Alternately, a sensing apparatus can be used on the wafer cassette assembly. The sensing apparatus can be a photodetector or similar device that senses if a wafer occupies a slot in the cassette. If no wafer occupies the slot, the cassette is moved to the next slot position. The process continues until all the slots in the cassette have been sensed.

Once all of the wafers are tested, the process is complete as indicated in step 114. The wafer cassette 82 can be removed and another placed on the apparatus to begin another cycle of wafer testing.

Figure 5:
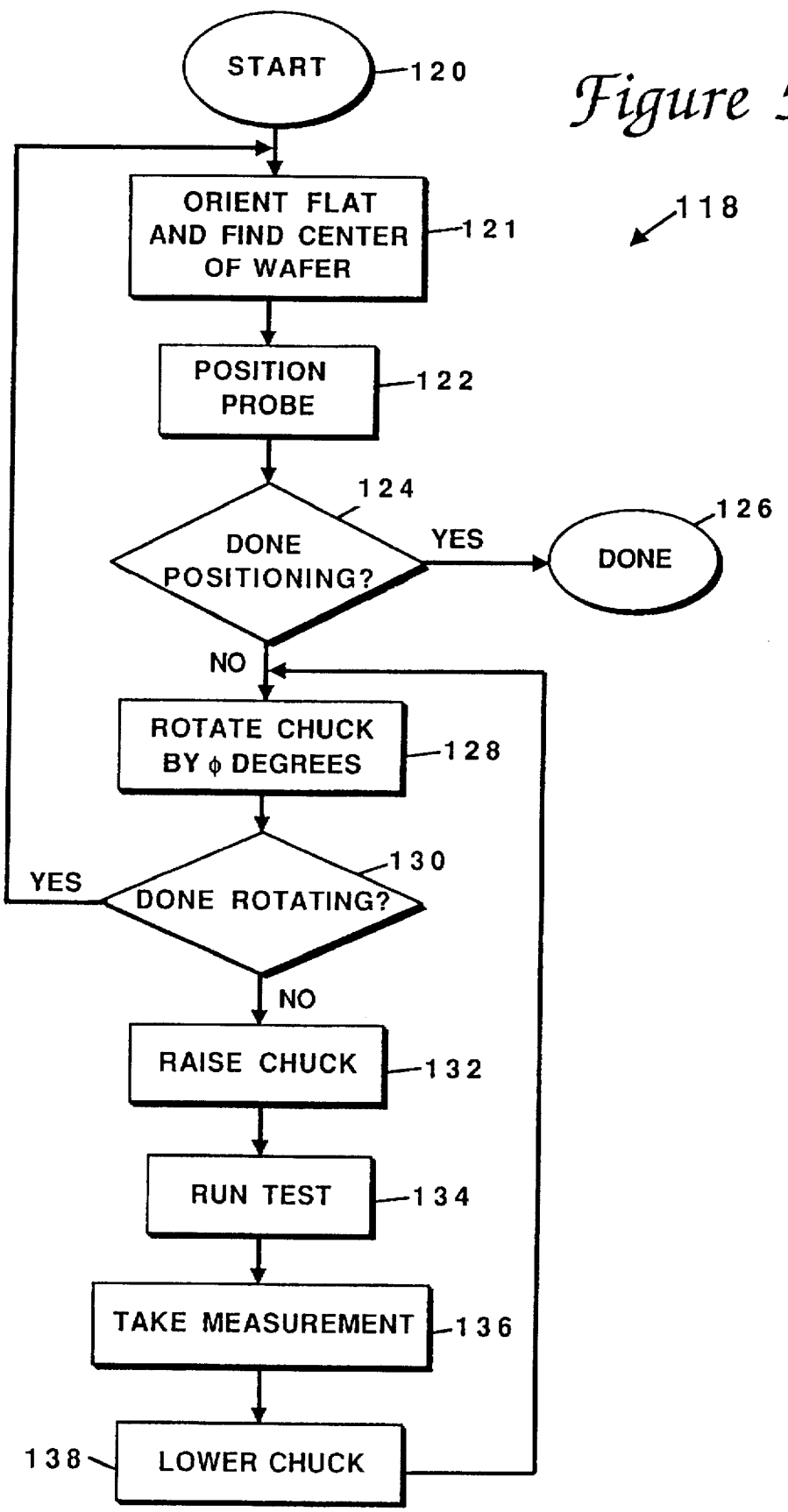
FIG. 5 is a flow diagram of a method to run the testing of a wafer with a probe assembly of the present invention.

FIG. 5 is a flow diagram 118 showing the process of testing a wafer. The wafer 38 has been placed on the chuck and the wafer pick 14 has retracted. The process starts in a step 120 and, in a step 121, a wafer flat, notch, or index mark is oriented and the wafer center is found. Flat-orientation can be accomplished by rotating the wafer by rotating the chuck 30 so that the wafer edge passes through a emitter/photodetector and blocks a detector from detecting an emitted beam. As the flat rotates through the beam, the beam is detected and the flat position is known and can be oriented in a certain direction. The center of the wafer is typically found by determining the coordinates of the perimeter of the wafer. Once the coordinates of the wafer center are determined, the computer 20 can compensate for any off-centeredness of the wafer or the chuck. Preferably, the wafer is either a larger diameter than the chuck 30, or a transparent chuck can be used so that the photodetector can detect the wafer edge through the chuck. Suitable wafer flat orienters and center finders are made by Brooks Automation of Santa Clara, Calif., and Genmark Automation of Sunnyvale, Calif.

Once the wafer center is located, step 122 is initiated. The probe assembly 16 is positioned over the wafer 18. The initial position of the probe assembly is preferably near the center of the wafer that was found in step 121.

In step 124, the status of the test is examined by the computer. The positioning of the probe assembly 16 indicates when the entire wafer has been tested. In the preferred embodiment, the probe assembly starts testing at the center of the wafer and incrementally moves parallel to the x-axis towards the outer edge of the wafer after the chuck incrementally rotates through 360 degrees (see below). In the preferred embodiment, the test head 76 is positioned at 25 to 1000 test points from the center to the edge of the wafer for a eight-inch wafer. When the probe assembly is positioned past the final testing position on the edge, the test is complete as indicated in step 126. In the preferred embodiment, the computer senses when the probes 78 of a four-point probe are no longer touching the wafer, since no current flows between the outer probes through the wafer.

If the probe assembly is not positioned at its final testing position as indicated in stop 124, then, in a step 128, testing chuck 30 is rotated by φ degrees. The angle φ that the chuck rotates is determined by the desired distance between test points on the wafer surface. If the operator wishes to test many points, the chuck rotates a small amount, e.g. 10°. The angle can also be variable, so that less points can be tested close to the center of the wafer where there is less circumference using a larger angle of rotation, and more points can be tested close to the edge of the wafer using a smaller angle of rotation. In the preferred embodiment, the chuck incrementally rotates by about 0.04 degrees.

In alternate embodiments, the chuck need not be rotated to test all the points on a wafer surface. The probe arm 74 can be set up to move along the x-axis and the y-axis and thus test all of the points on the wafer surface in a grid pattern. In such an embodiment, the probes 78 of the test head 76 can test points along x-axis rows and y-axis rows as detailed below with reference to FIG. 6.

In another embodiment, the probe assembly can be stationary, while the chuck can elevate, rotate, and move along the x-axis or the y-axis. This latter embodiment tests the wafer in the same test point pattern as the preferred embodiment, with the main difference being that the chuck is the only moving part.

In step 130, the computer checks if a full rotation (i.e. 360°) of the chuck has been completed. If a full rotation has been completed, the probe assembly 16 is positioned to the next testing position parallel to the x-axis as indicated in step 122. If a full rotation has not been completed, the test point is tested as indicated in steps 132 through 136.

In step 132, the testing chuck 30 raises to engage the wafer surface with the probe assembly at the current test point. This is accomplished as described with reference to FIG. 2. In step 134, the testing is completed. The tests can include resistivity measurements of the wafer, sheet resistance measurements of the film on the wafer surface, or any other kind of test performed on a wafer. Test circuitry 22 is used to perform the tests.

In step 136, testing chuck 30 is lowered to disengage the wafer surface from the test head. The process then starts again at step 128, where the chuck is rotated to the next test point and the computer checks if a full rotation has been completed. In this way, substantially the entire surface of the wafer is tested in consecutive concentric rings going out from the center to the edge of the wafer 18.

Figure 6A:
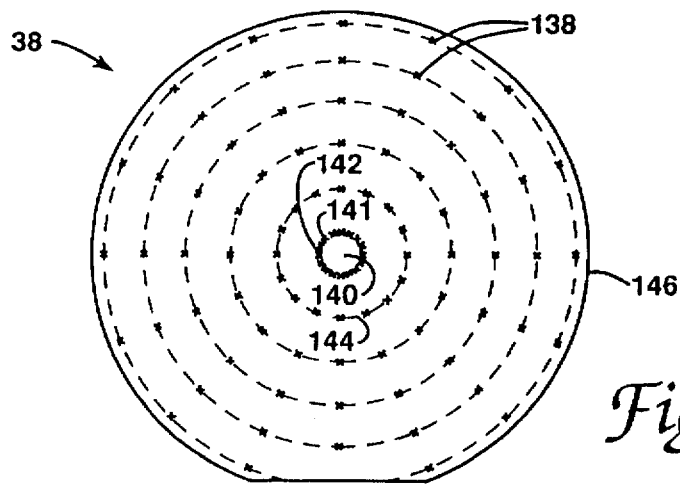
FIGS. 6a–6c are top plan views of different testing patterns on a wafer surface.
Figure 6B:
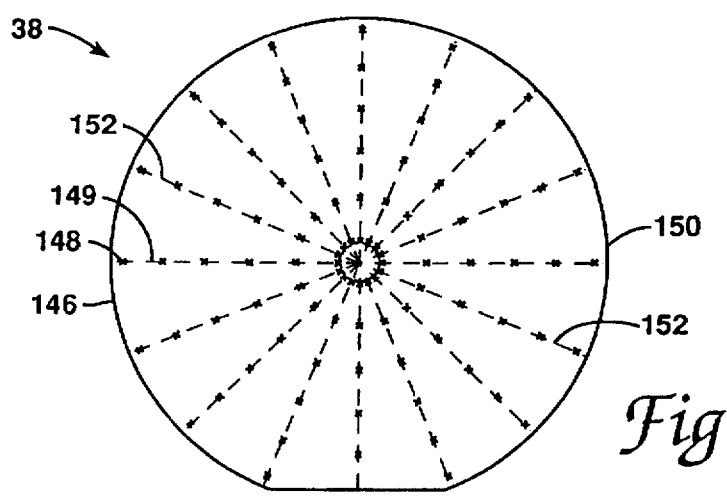
Figure 6C:
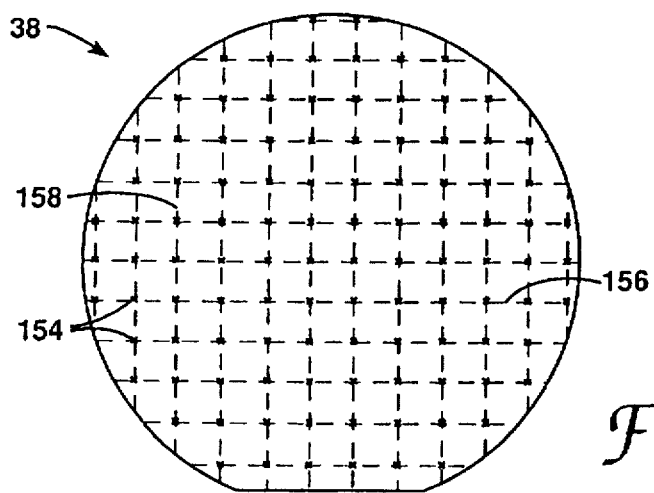

FIGS. 6a, 6b and 6c show patterns of testing points on a wafer surface. FIG. 6a shows a top plan view of a pattern of testing a wafer as described in FIG. 5. Wafer 38 is tested by probe assembly 16 at several test points 138. The test head 76 starts testing the wafer at a test point near the center 140 of the wafer surface, such as test point 141. A circle 142 of test points is tested by incrementally rotating the chuck to each test point on the circle. When circle 142 has been tested, the probe assembly moves parallel to the x-axis to circle 144, where testing continues. Circles of test points are tested in this manner until the probe assembly reaches the outer edge 146 of the wafer.

Alternatively, the test points can be tested in a pattern as shown in FIG. 6b. In this pattern, the probe assembly 16 starts testing at a point at the edge 146 of the wafer 38, such as at test point 148. After a point is tested, the probe assembly moves parallel to the x-axis and tests another point. Test points are tested in this linear manner along line 149 until the probe reaches the opposite edge 150 of the wafer. The wafer is then incrementally rotated, and the probe assembly starts testing another line of test points 152. Several diameters or chords across the wafer surface are thus tested using this pattern, and substantially the entire wafer surface is tested.

FIG. 6c shows an alternative testing pattern that can be used with the present invention. The probe assembly 16 or the testing chuck 30 move parallel to the x-axis and the y-axis so that a grid of test points 154 is tested. The probes 78 of the test head 76 can test each test point along an x-axis row 156, then move slightly along the y-axis and test each point along the next x-axis row, and so on. The grid pattern can also be accomplished by moving the probe assembly along the x-axis and rotating the chuck simultaneously to test the desired pattern of points.

While this invention has been described in terms of several preferred embodiments, it is contemplated that alterations, modifications and permutations thereof will become apparent to those skilled in the art upon a reading of the specification and study of the drawings. It is intended that the claims include all such alterations, modifications and permutations as fall within the spirit and scope of the present invention.

What is claimed is:

1. A method for testing a surface of a planar workpiece comprising:
    a) placing a workpiece on a support surface such that a test surface of said workpiece faces upwardly;
    b) moving a test head to a position above said workpiece, said test head being moved in an x-direction along an x-axis parallel to said test surface of said workpiece;
    c) moving said support surface upwardly to cause said test surface to engage said test head positioned above said workpiece;
    d) moving said support surface downwardly to disengage said test head from said workpiece;
    e) translating said test head parallel to the plane of said workpiece; and
    f) repeating steps c and d.

2. A method as recited in claim 1 wherein said step of placing a workpiece on a support surface is accomplished with a handling apparatus movable only in a linear x-direction along said x-axis.

3. A method as recited in claim 2 wherein said step of placing a workpiece on a support surface is accomplished with said handling apparatus controlled by a digital computer.

4. A method as recited in claim 3 further comprising removing said workpiece from said support surface and placing a different workpiece on said support surface after step (f).

5. A method as recited in claim 2 further comprising a step of finding the center of said test surface of said workpiece after said step of placing a workpiece on a support surface.

6. A method as recited in claim 2 wherein said step of translating said test head includes translating said test head in an x-direction along said x-axis.

7. A method as recited in claim 6 wherein said handling apparatus retrieves said workpiece from a workpiece cassette movable upwardly and downwardly long a second z-axis such that said wafer cassette, said support, said test head, and said handling apparatus are aligned approximately on said x-axis.

8. A method as recited in claim 1 further comprising:
    rotating a chuck that includes said support surface; and
    maintaining said chuck during said steps c), d), and e) at a stationary position with respect to translatory movement in a plane parallel to said support surface.

9. A method as recited in claim 8 further comprising a step of finding an index mark of said workpiece after said step of placing a workpiece on a support surface.

10. A method for testing a surface of a planar workpiece comprising:
    a) placing a workpiece on a support surface of a chuck such that a test surface of said workpiece faces upwardly, said step of placing being accomplished with a handler movable only along an x-axis parallel to an x-y plane of said test surface of said workpiece;
    b) moving a test head along an x-axis until said test head is positioned above said workpiece;
    c) moving said chuck upwardly along a z-axis to cause said test surface to engage said test head;
    d) testing a property of said workpiece using said test head;
    e) moving said chuck downwardly to disengage said test head from said workpiece;
    f) translating said test head in a plane parallel to said x-y plane;
    g) maintaining said chuck at a stationary position with respect to translation in a plane parallel to said x-y plane during said steps of moving said chuck upwardly and downwardly, said step of testing, and said step of translating said test head; and
    h) repeating said moving said chuck upwardly, said testing, and said moving said chuck downwardly to engage said test head at a different location on said test surface of said workpiece.

11. A method as recited in claim 10 further comprising finding the center of said test surface of said workpiece after said step of placing a workpiece on a support surface.

12. A method as recited in claim 10 further comprising rotating said chuck in said x-y plane about a z-axis.

13. A method as recited in claim 10 wherein said translating said test head includes translating said test head only along said x-axis of said handler.

14. A method as recited in claim 10 further comprising removing said workpiece from said support surface using said handler and placing a different workpiece on said support surface using said handler after said repeating step.

15. A method as recited in claim 14 wherein said testing a property of said chuck includes determining a resistivity of said chuck using readings developed by said test head on said test surface of said chuck.

16. A method as recited in claim 10 wherein said handler retrieves said workpiece from a workpiece cassette movable upwardly and downwardly along a second z-axis, said workpiece cassette being aligned with said handler along said x-axis such that said wafer chuck, said wafer cassette, and said handler are positioned approximately on said x-axis.

17. A method for handling and testing a planar workpiece comprising the steps of:
    a) placing a workpiece on a support surface such that a test surface of said workpiece faces upwardly;
    b) translating a test head in an x-y plane until said test head is positioned above said workpiece;
    c) moving said support upwardly to cause a test point on said test surface to engage said test head positioned above said workpiece so that testing of said workpiece can begin;
    d) moving said support downwardly to disengage said test head from said workpiece when testing at said test point is complete; and
    e) repeating steps c and d for a plurality of different test points on said test surface, wherein at least two of said different test points are at a different distance from a center of rotation of said support, and wherein said support remains stationary in said x-y plane with respect to translation in a plane parallel to said x-y plane during the testing of said different test points.

18. A method as recited in claim 17 wherein said step e includes translating said test head parallel to a plane of said workpiece to test said test points at different distances from said center of said workpiece.

19. A method as recited in claim 18 wherein said support is a chuck movable upwardly and downwardly along a z-axis and rotatable in said x-y plane substantially perpendicular to said z-axis, and further comprising rotating said chuck in said x-y plane.

20. A method as recited in claim 19 further comprising rotating said chuck to allow said test head to test different test points in a circle about said center of rotation of said chuck, such that a plurality of circular configurations of said different test points are tested by combining said rotation and said translation of said test head.

21. A method as recited in claim 17 wherein said step of placing is accomplished with a handler movable only in an x-direction parallel to a plane of said test surface of said workpiece.

22. A method as recited in claim 21 wherein said handler retrieves said workpiece from a workpiece cassette movable upwardly and downwardly long said z-axis, said workpiece cassette being aligned with said handler along said x-axis such that said wafer chuck, said wafer cassette, and said handler are positioned approximately on said x-axis.

23. A method as recited in claim 22 further comprising the steps of:

removing said workpiece from said chuck;

moving said workpiece cassette along said z-axis, said workpiece cassette including a plurality of workpieces; and retrieving a different workpiece from said cassette and placing said different workpiece on said chuck.

24. A method as recited in claim 22 wherein said test head may translate only along said x-axis such that said support, said wafer cassette, said test head, and said handler are aligned approximately on said x-axis.

* * * * *